US009620480B1

(12) United States Patent
Dimaculangan et al.

(10) Patent No.: US 9,620,480 B1
(45) Date of Patent: *Apr. 11, 2017

(54) INTEGRATED CIRCUIT PACKAGING SYSTEM WITH UNPLATED LEADFRAME AND METHOD OF MANUFACTURE THEREOF

(71) Applicants: Garret Dimaculangan, Singapore (SG); Linda Pei Ee Chua, Singapore (SG); Byung Tai Do, Singapore (SG); Arnel Senosa Trasporto, Singapore (SG)

(72) Inventors: Garret Dimaculangan, Singapore (SG); Linda Pei Ee Chua, Singapore (SG); Byung Tai Do, Singapore (SG); Arnel Senosa Trasporto, Singapore (SG)

(73) Assignee: STATS ChipPAC Pte. Ltd, Singapore (SG)

( * ) Notice: Subject to any disclaimer, the term of this patent is extended or adjusted under 35 U.S.C. 154(b) by 243 days.

This patent is subject to a terminal disclaimer.

(21) Appl. No.: 13/930,287

(22) Filed: Jun. 28, 2013

(51) Int. Cl.
*H01L 23/495* (2006.01)
*H01L 23/52* (2006.01)
*H01L 21/48* (2006.01)
*H01L 21/56* (2006.01)
*H01L 23/00* (2006.01)

(52) U.S. Cl.
CPC ............ *H01L 24/89* (2013.01); *H01L 23/495* (2013.01); *H01L 21/4821* (2013.01); *H01L 21/56* (2013.01); *H01L 23/49558* (2013.01); *H01L 23/49586* (2013.01); *H01L 23/52* (2013.01)

(58) Field of Classification Search
CPC ............ H01L 23/495; H01L 23/49558; H01L 23/49586; H01L 23/52; H01L 21/4821; H01L 21/56
See application file for complete search history.

(56) References Cited

U.S. PATENT DOCUMENTS

| 6,255,740 | B1 * | 7/2001 | Tsuji ..................... H01L 21/565 257/668 |
| 6,964,918 | B1 | 11/2005 | Fan et al. |
| 7,232,755 | B1 * | 6/2007 | McLellan et al. ............ 438/674 |
| 7,504,716 | B2 * | 3/2009 | Abbott ................ H01L 21/4828 257/678 |
| 7,662,672 | B2 | 2/2010 | Lin |
| 7,741,149 | B2 | 6/2010 | Qiao et al. |
| 8,129,229 | B1 * | 3/2012 | Sirinorakul et al. .......... 438/123 |

(Continued)

OTHER PUBLICATIONS

U.S. Appl. No. 13/930,261, filed Jun. 28, 2013, Do et al.
U.S. Appl. No. 13/930,319, filed Jun. 28, 2013, Do et al.

*Primary Examiner* — David Zarneke
(74) *Attorney, Agent, or Firm* — Wong & Rees LLP

(57) ABSTRACT

An integrated circuit packaging system and method of manufacture thereof including: providing an unplated leadframe having a contact protrusion; forming a contact pad and traces by etching the unplated leadframe; applying a trace protection layer on the contact pad and the traces; forming a recess in the trace protection layer by etching a top surface of the contact pad to a recess distance below a top surface of the trace protection layer; and depositing an external connector directly on the top surface of the contact pad.

10 Claims, 6 Drawing Sheets

(56) References Cited

U.S. PATENT DOCUMENTS

| | | |
|---|---|---|
| 8,227,295 B2 * | 7/2012 | Simmons-Matthews .................. H01L 21/76898 438/109 |
| 8,455,304 B2 | 6/2013 | Lam |
| 8,987,060 B2 * | 3/2015 | Yen ............................... 438/121 |
| 9,190,349 B1 * | 11/2015 | Do ....................... H01L 21/4828 |
| 2005/0199995 A1 * | 9/2005 | Nomoto et al. .............. 257/692 |
| 2009/0302445 A1 | 12/2009 | Pagaila et al. |
| 2011/0074026 A1 | 3/2011 | Shim et al. |
| 2011/0079885 A1 | 4/2011 | Camacho et al. |
| 2011/0227211 A1 | 9/2011 | Camacho et al. |
| 2012/0007234 A1 | 1/2012 | Tsai et al. |
| 2012/0139104 A1 | 6/2012 | Camacho et al. |
| 2012/0146200 A1 | 6/2012 | McMillan et al. |
| 2012/0181680 A1 | 7/2012 | Li |
| 2012/0205811 A1 | 8/2012 | Do et al. |
| 2012/0241973 A1 | 9/2012 | Chua et al. |
| 2012/0280377 A1 | 11/2012 | Do et al. |
| 2012/0280407 A1 | 11/2012 | Do et al. |
| 2013/0154072 A1 | 6/2013 | Do et al. |
| 2013/0154119 A1 | 6/2013 | Do et al. |
| 2013/0256861 A1 | 10/2013 | Do et al. |
| 2014/0008774 A1 | 1/2014 | Do et al. |
| 2014/0165389 A1 | 6/2014 | Do et al. |
| 2014/0167236 A1 | 6/2014 | Do et al. |
| 2015/0084172 A1 * | 3/2015 | Do et al. ....................... 257/676 |

\* cited by examiner

INTEGRATED CIRCUIT PACKAGING SYSTEM WITH UNPLATED LEADFRAME AND METHOD OF MANUFACTURE THEREOF

CROSS-REFERENCE TO RELATED APPLICATION(S)

The present application contains subject matter related to concurrently filed U.S. patent application Ser. No. 13/930, 261. The related application is assigned to STATS ChipPAC Ltd., and the subject matter thereof is incorporated in its entirety herein by reference thereto.

The present application contains subject matter related to concurrently filed U.S. patent application Ser. No. 13/930, 319. The related application is assigned to STATS ChipPAC Ltd., and the subject matter thereof is incorporated in its entirety herein by reference thereto.

TECHNICAL FIELD

The present invention relates generally to an integrated circuit packaging system, and more particularly to a system formed from a leadframe.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, a leadframe will come from a supplier pre-plated with a desired pattern for further processing. The plating can protect selected portions of the leadframe during processing steps, but the plating itself uses relatively expensive materials, and under certain conditions it may be desirable to remove the plating. The die and portions of the leadframe are encapsulated with a molding material to protect the delicate electrical components on the active side of the die while leaving selected portions of the leadframe exposed to facilitate electrical connection to external devices.

Thus, a need still remains for a better manufacturing system. In view of the rising costs of materials, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an unplated leadframe having a contact protrusion; forming a contact pad and traces by etching the unplated leadframe; applying a trace protection layer on the contact pad and the traces; forming a recess in the trace protection layer by etching a top surface of the contact pad to a recess distance below a top surface of the trace protection layer; and depositing an external connector directly on the top surface of the contact pad.

The present invention provides an integrated circuit packaging system, including: a contact pad; traces connected to the contact pad; a trace protection layer on the contact pad and the traces, the trace protection layer having a recess with a top surface of the contact pad a recess distance below a top surface of the trace protection layer; and an external connector directly on the top surface of the contact pad.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
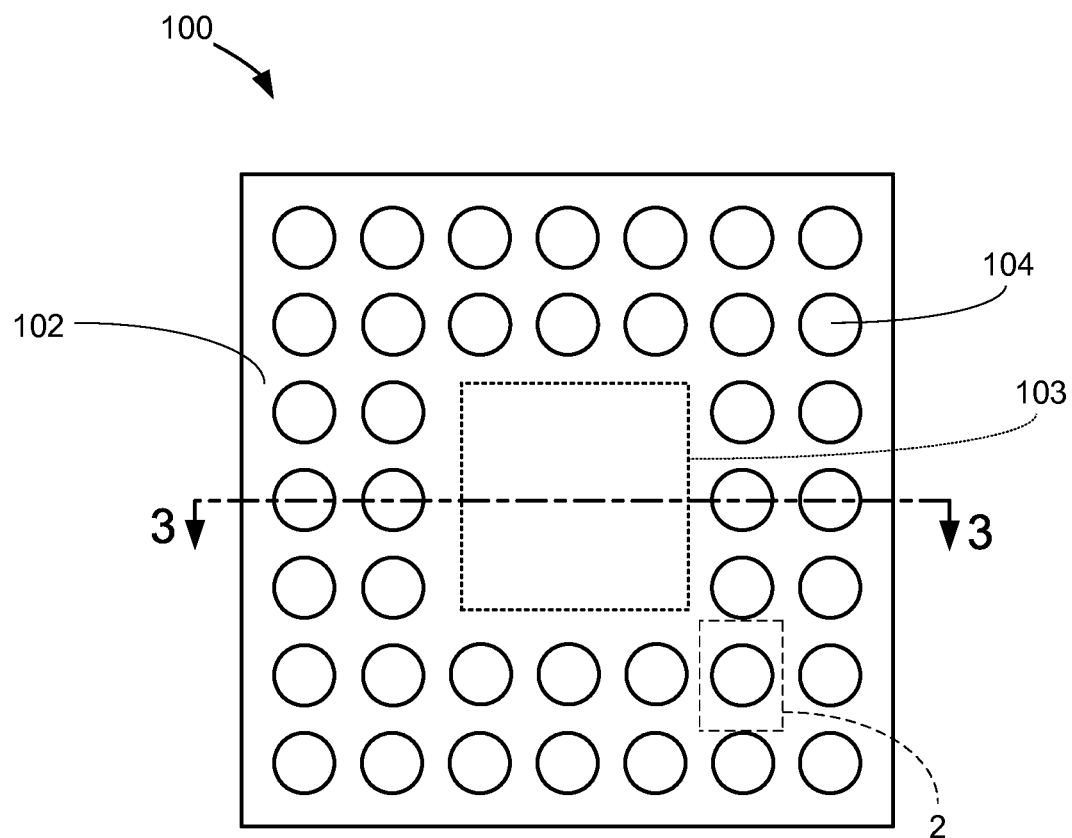
FIG. 1 is a bottom view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the contact pad, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in an embodiment of the present invention. The bottom view shows a trace protection layer 102 and external connectors 104. An integrated circuit die 103 is shown with a dotted square. The integrated circuit die 103 can be connected to the external connectors through internal connectors (not shown). The integrated circuit die 103 is shown as centrally located and of a particular size, though it is understood that this is for illustrative purposes only, and the integrated circuit die 103 can be larger, smaller, or located in an offset position.

The trace protection layer 102 protects and holds traces and contacts in place, and can be made from a material such as epoxy molding compound, resin, moldable underfill, a curable compound, or other non-conductive material. The trace protection layer 102 is shown as opaque, but it is understood that a translucent or transparent material may be used.

The external connectors 104, such as solder balls, can be connected to contact pads through the trace protection layer 102. The external connectors 104 function to electrically connect the integrated circuit die 103 to the outside of the integrated circuit packaging system 100.

Figure 2:
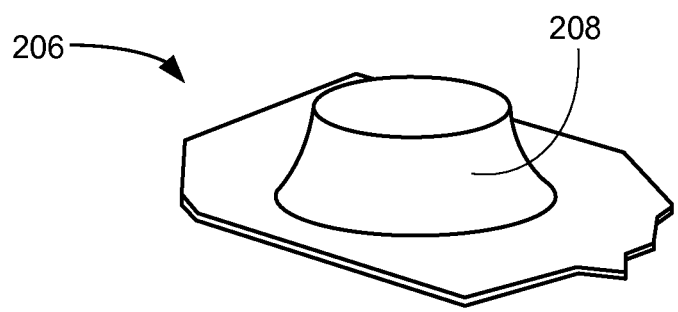
FIG. 2 is a detailed isometric view of FIG. 1 within the inset depicted by the dotted rectangle 2 of FIG. 1 in a beginning phase of manufacture.

Referring now to FIG. 2, therein is shown a detailed isometric view of FIG. 1 within the inset depicted by the dotted rectangle 2 of FIG. 1 in a beginning phase of manufacture. The detailed view shows a portion of an unplated leadframe 206 having one of many contact protrusions 208. The one of many contact protrusions 208 is shown as an example, and it is understood that each of the contact protrusions 208 present in the unplated leadframe 206 undergo the same processing.

The unplated leadframe 206 can be pre-stamped or pre-etched metal, such as copper, such that the contact protrusions 208 of the unplated leadframe 206 can function as contact pads after further processing. The contact protrusions 208 can have curved sides as a result of an etching process. The contact protrusions 208 can be formed by etching through most or half of the thickness of the unplated leadframe 206. Notably, the unplated leadframe 206 enters the manufacturing process without being pre-plated with metals such as nickel, palladium, or gold.

The unplated leadframe 206 has the integrated circuit die 103 of FIG. 1 connected to the contact protrusions 208 on bottom of the unplated leadframe 206, on the side of the contact protrusions 208 not visible in FIG. 2. The integrated circuit die 103 can be connected through internal connectors (not shown) such as solder balls, conductive posts, wire bonds, or a combination thereof.

It has been discovered that using the unplated leadframe 206 without pre-plated material can reduce cost, decrease product lead time, and increase etch efficiency. Avoiding the use of expensive plating materials as an etch stop can increase efficiency because a time-consuming removal process can be avoided. When forming a package having recessed contact pads, pre-plated material adds unnecessary steps, and therefore using the unplated leadframe 206 without pre-plated material increases production efficiency.

Figure 3A:
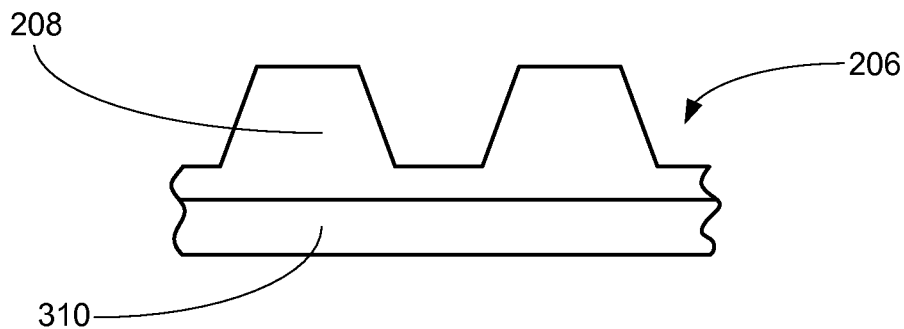
FIG. 3A is a partial cross-sectional view of the unplated leadframe exemplified by the section line 3-3 of FIG. 1 in an encapsulation phase of manufacture.

Referring now to FIG. 3A, therein is shown a partial cross-sectional view of the unplated leadframe 206 exemplified by the section line 3-3 of FIG. 1 in an encapsulation phase of manufacture. In this view is shown an encapsulation 310 covering one side of a portion of the unplated leadframe 206 on which the integrated circuit die 103 of FIG. 1 is attached, leaving the contact protrusions 208 exposed.

Figure 3B:
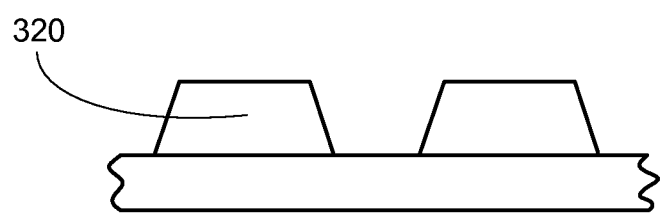
FIG. 3B is the structure of FIG. 3A in an etching phase of manufacture.

Referring now to FIG. 3B, therein is shown the structure of FIG. 3A in an etching phase of manufacture. The unplated leadframe 206 of FIG. 2 can be masked and etched to remove material from the contact protrusions 208 of FIG. 2 to form contact pads 320, which are electrically isolated from each other, while also forming traces for routing to and from the contact pads 320. The etching process can etch away a portion of the top and sides of the contact protrusions 208, forming the contact pads 320. The etching process can be controlled to stop etching as soon as the traces are fully formed, and can be isotropic or anisotropic.

It has been discovered that the etching process to form the contact pads 320 and traces from the unplated leadframe 206 results in a lower package height as compared to using a pre-plated leadframe. Because the etching process etches the top surface of the contact pads 320 while forming the traces, the final height and diameter of the contact pads 320 will be lower than if the top of the contact pads 320 were protected by pre-deposited plating. The etching process can etch at a known rate, and therefore the final size of the contact pads 320 can be controlled by controlling the incoming size of the contact protrusions 208. For example, if the contact protrusions come in from 350 to 400 micrometers, the etching process can lead to a final size of 250 micrometers for the contact pads 320.

Figure 4A:
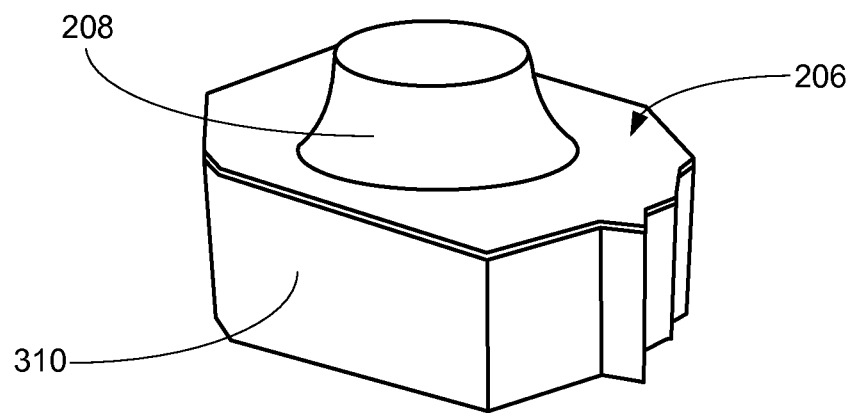
FIG. 4A is the structure of FIG. 2 in an encapsulation phase of manufacture.

Referring now to FIG. 4A, therein is shown the structure of FIG. 2 in an encapsulation phase of manufacture. This isometric view shows the encapsulation 310 covering one side of the unplated leadframe 206 on which the integrated circuit die 103 of FIG. 1 is attached, leaving the other side of the unplated leadframe 206 and the contact protrusions 208 exposed from the encapsulation 310. The encapsulation 310 can be applied through a process such as injection molding, film-assist molding, or other encapsulation process.

Figure 4B:
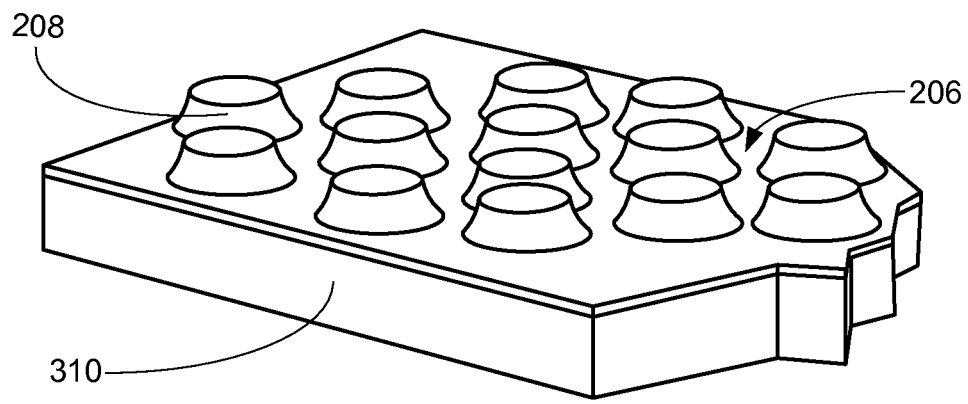
FIG. 4B is an expanded view of FIG. 4A.

Referring now to FIG. 4B, therein is shown an expanded view of FIG. 4A. This isometric view shows a larger portion of the unplated leadframe 206 than FIG. 4A, showing the contact protrusions 208 arranged in an example of an array over the encapsulation 310. For example, the contact protrusions 208 can be in a regular array, staggered, or other configuration to conform to trace routing needs.

Figure 5:
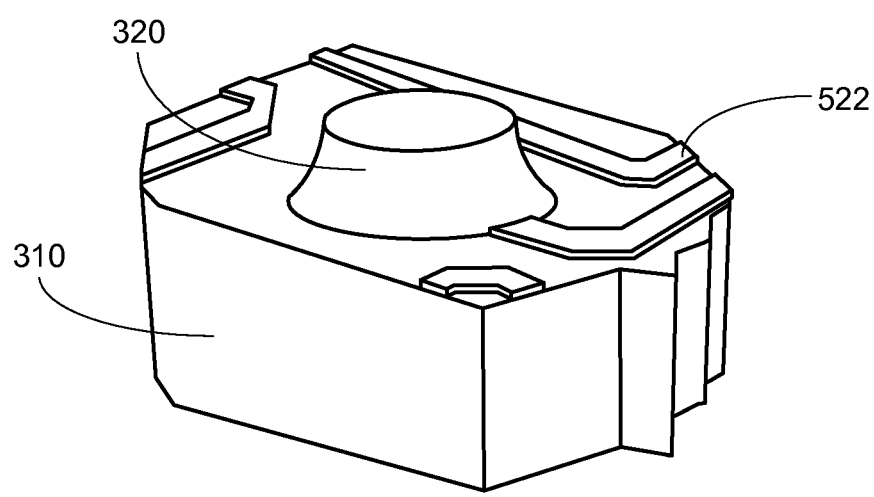
FIG. 5 is the structure of FIG. 4A in a first etching phase of manufacture.

Referring now to FIG. 5, therein is shown the structure of FIG. 4A in a first etching phase of manufacture. A mask or patterned etch resist layer (not shown) can be applied to the unplated leadframe 206 of FIG. 2 followed by an etching step to form traces 522, one of which is shown connected to one of the contact pads 320. The etching process can be anisotropic or isotropic and can etch away a portion of the contact protrusions 208 of FIG. 2, forming the contact pads 320, which are shorter in height than the contact protrusions 208 were. The mask or etch resist layer can then be removed, leaving the contact pads 320 and the traces 522 on the encapsulation 310.

In this example, only one of the contact pads 320 and a portion of the traces 522 are shown, though it is understood that there can be more of the contact pads 320 (as can be seen by the numerous contact protrusions 208 in FIG. 4B), each connected to one or more of the traces 522, arranged in a regular or staggered array, for example. Each of the contact pads 320 can have curved or generally sides depending on the type of etching process used.

It has been discovered that the risk of trace lifting can be reduced or eliminated by using the unplated leadframe 206 rather than a pre-plated leadframe. For example, if the leadframe comes pre-plated, removal of the plating before trace protection processes can be incomplete, resulting in "dog ear" remnants of plating at the periphery of the contact pads 320, which could necessitate an additional removal process such as high pressure water jet removal, which can result in trace "lift," or damage/movement of the traces. Movement of traces can also result in short-circuits, so avoiding trace lift can also improve reliability and manufacturing yield.

Figure 6:
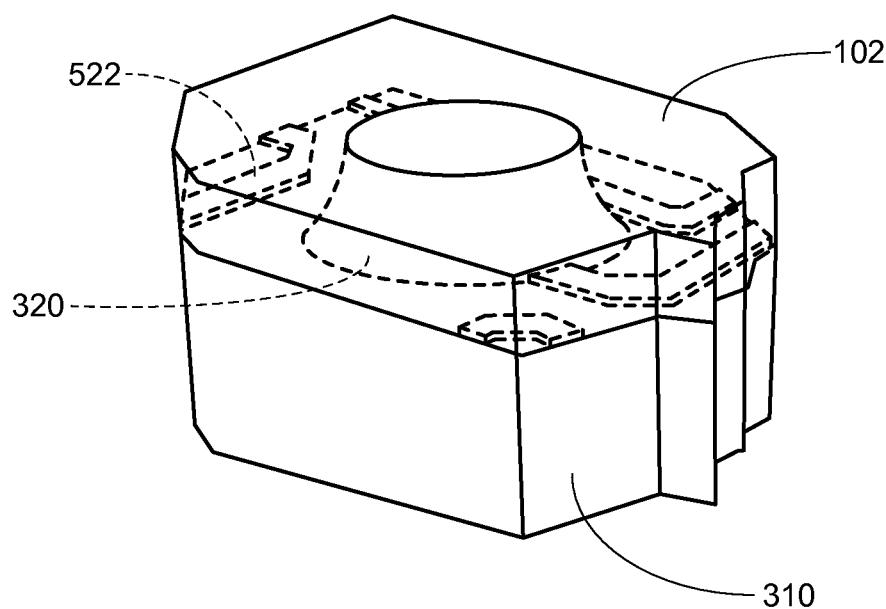
FIG. 6 is the structure of FIG. 5 in a trace protection phase of manufacture.

Referring now to FIG. 6, therein is shown the structure of FIG. 5 in a trace protection phase of manufacture. Following the removal of the mask or etch resist layer, the exposed surfaces of the contact pads 320 and the traces 522 can be cleaned of impurities and oxides through a process such as a plasma clean. Following the cleaning step, the trace protection layer 102 can be applied to cover and directly contact the traces 522, most of each of the contact pads 320, and the side of the encapsulation 310 having the traces 522. Features covered by the trace protection layer 102 are shown with dotted lines. Dotted lead lines are used to point to features that are ordinarily not visible.

Figure 7A:
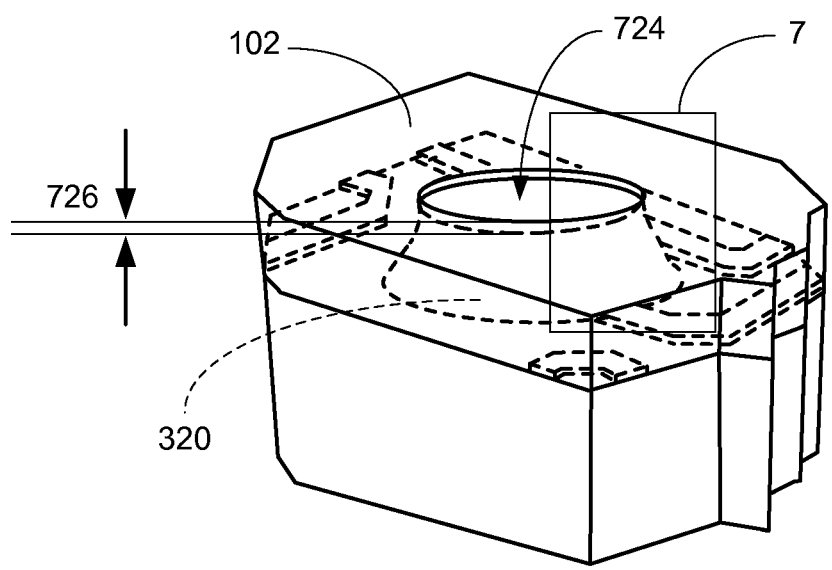
FIG. 7A is the structure of FIG. 6 in a second etching phase of manufacture.

Referring now to FIG. 7A, therein is shown the structure of FIG. 6 in a second etching phase of manufacture. After the application of the trace protection layer 102, a buffing step can be performed on a top surface of the trace protection layer 102. For example, the buffing step can be a planarization process such as chemical mechanical planarization (CMP). The buffing step can remove a portion of the trace protection layer 102 or the contact pads 320 such that the top surface of the contact pads 320 is planar with the top surface of the trace protection layer 102. For example, in case of excess amounts of the trace protection layer 102 "flashing" over the top surface of the contact pads 320, the buffing step can remove the excess material while also ensuring planarity.

The buffing step can be followed by a second etching step, which can remove the material of the contact pads 320 without removing the material of the trace protection layer 102 so as to form a recess 724 in the trace protection layer 102 wherein the top surface of the contact pads 320 is the bottom of the recess 724 and is a recess distance 726 below the top surface of the trace protection layer 102. The recess distance 726 is defined as the distance between the top surface of the trace protection layer 102 and the highest point of the top surface of the contact pads 320. In this example, the top surface of one of the contact pads 320 is shown as planar or flat, though it is understood that the top surface of the contact pads 320 can be concave or bowl-shaped due to an anisotropic etching method, with the central portion of the contact pads 320 lower than the outer edges. The etching process can leave the top surface of the contact pads 320 without defects.

Alternatively, the CMP process can be performed using slurry selective for the material of the contact pads 320, removing only a portion of the contact pads 320 but not a significant amount of the trace protection layer 102. Dishing artifacts from the CMP process can leave the top surface of the contact pads 320 as concave. The selectivity of the process can form the recess 724 in the trace protection layer 102 and leave the top surface of the contact pads 320 the recess distance 726 below the top surface of the trace protection layer 102.

It has been discovered that avoiding the use of pre-plated material during the formation of the contact pads 320 lowers cost and improves reliability. The removal of material in two etching steps to form the recess 724 is easier without the necessity of removing any pre-plated material, and reduces the chance of contamination and entirely removes the chance of "dog ear" defects resulting from remnants of pre-plated material insufficiently removed. Such defects can cause connection problems when connecting to the contact pads 320, but reducing or eliminating the chance of such defects will increase reliability in connectivity and reduce cost.

Figure 7B:
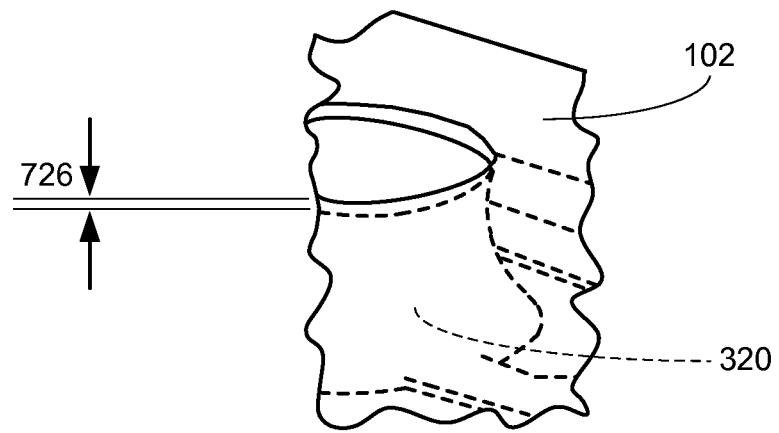
FIG. 7B is a detailed view of FIG. 7A within the inset depicted by the solid rectangle 7 of FIG. 7A.

Referring now to FIG. 7B, therein is shown a detailed view of FIG. 7A within the inset depicted by the solid rectangle 7 of FIG. 7A. In this view can be clearly seen one of the contact pads 320, the trace protection layer 102, and the recess distance 726 between them.

Figure 8:
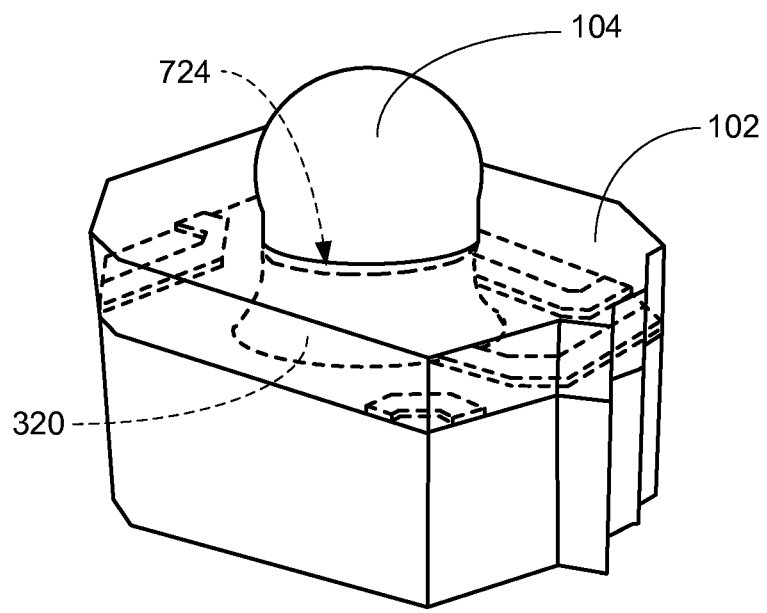
FIG. 8 is the structure of FIG. 7A in a ball attach phase of manufacture.

Referring now to FIG. 8, therein is shown the structure of FIG. 7A in a ball attach phase of manufacture. Following the second etching step to form the recess 724 in the trace protection layer 102, the external connectors 104 can be deposited directly in the recess 724, directly on the contact pads 320, and without using a solder-wettable plating layer. This can be followed by a reflow step where the external connectors 104, such as solder balls, are reflowed to fully cover the exposed surface of the contact pads 320 and fill the recess 724 in the trace protection layer 102. The contact pads 320 being recessed into the trace protection layer 102 can ensure a strong connection is maintained between the external connectors 104 and the contact pads 320.

It has been discovered that the use of an unplated leadframe to form the recess 724 in the trace protection layer 102 increases reliability and product yield. So-called "mouse bite" defects can result from etchant residues etching small holes in surfaces they were not intended to etch. Because there is no need for a separate etching step to remove pre-plated material from the unplated leadframe 206 of FIG.

2, which can leave plating remnants and an uneven surface, there is zero occurrence of the mouse bite defects on the contact pads 320, and therefore better adhesion of the external connectors 104 to each of the contact pads 320, increasing reliability and yield.

Thus, it has been discovered that the integrated circuit packaging system 100 and method of manufacture of the present invention furnishes important and heretofore unknown and unavailable solutions, capabilities, and functional aspects for manufacturing packages without using plating.

Figure 9:
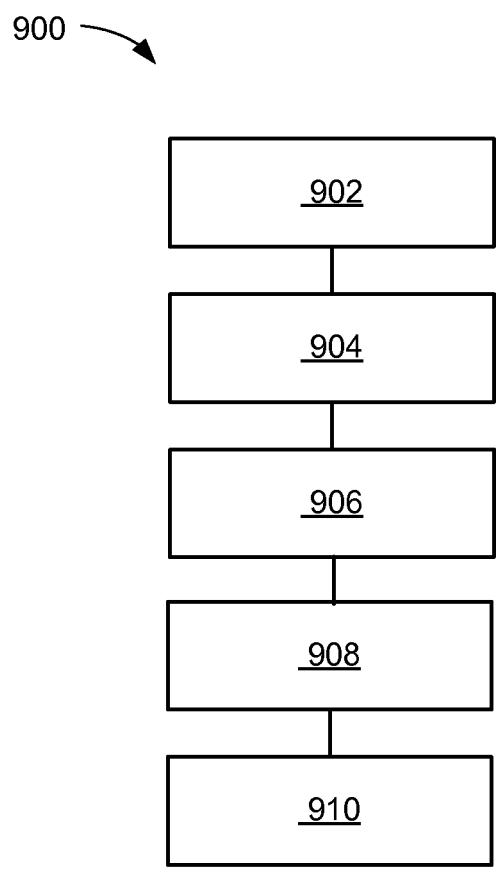
FIG. 9 is a flow chart of a method of manufacture of the integrated circuit packaging system in a further embodiment of the present invention.

Referring now to FIG. 9, therein is shown a flow chart of a method 900 of manufacture of the integrated circuit packaging system in a further embodiment of the present invention. The method 900 includes: providing an unplated leadframe having a contact protrusion in a block 902; forming a contact pad and traces by etching the unplated leadframe in a block 904; applying a trace protection layer on the contact pad and the traces in a block 906; forming a recess in the trace protection layer by etching a top surface of the contact pad to a recess distance below a top surface of the trace protection layer in a block 908; and depositing an external connector directly on the top surface of the contact pad in a block 910.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a contact pad and traces by etching an unplated leadframe, the unplated leadframe having a contact protrusion;
    applying a trace protection layer on the contact pad and the traces;
    forming a recess in the trace protection layer by etching a top surface of the contact pad to a recess distance below a top surface of the trace protection layer; and
    depositing an external connector directly on the top surface of the contact pad.

2. The method as claimed in claim 1 further comprising:
    connecting an integrated circuit die to the contact protrusion; and
    depositing an encapsulation on the integrated circuit die and the unplated leadframe.

3. The method as claimed in claim 1 wherein forming the contact pad and the traces includes forming the contact pad and the traces using an anisotropic etching process.

4. The method as claimed in claim 1 wherein depositing the external connector includes depositing the external connector in the recess.

5. The method as claimed in claim 1 further comprising cleaning the contact pad and the traces using a plasma cleaning process.

6. A method of manufacture of an integrated circuit packaging system comprising:
    connecting an integrated circuit die to a contact protrusion of an unplated leadframe;
    depositing an encapsulation on the integrated circuit die and the unplated leadframe;
    forming a contact pad and traces by etching the unplated leadframe;
    applying a trace protection layer on the contact pad and the traces;
    forming a recess in the trace protection layer by etching a top surface of the contact pad to a recess distance below a top surface of the trace protection layer; and
    depositing an external connector directly on the top surface of the contact pad.

7. The method as claimed in claim 6 wherein etching the top surface of the contact pad includes etching the top surface of the contact pad without creating defects, the top surface having a concave surface.

8. The method as claimed in claim 6 wherein forming the recess includes removing a portion of the trace protection layer with a buffing process.

9. The method as claimed in claim 6 wherein forming the recess includes removing a portion of the contact pad and a portion of the trace protection layer with chemical mechanical planarization.

10. The method as claimed in claim 6 wherein applying the trace protection layer includes applying the trace protection layer on the traces, the encapsulation, and the contact pad.

* * * * *